United States Patent
Yamanaka et al.

(10) Patent No.: US 7,408,242 B2
(45) Date of Patent: Aug. 5, 2008

(54) CARRIER WITH REINFORCED LEADS THAT ARE TO BE CONNECTED TO A CHIP

(75) Inventors: Syuichi Yamanaka, Tokyo (JP); Tomiichi Shibata, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 10 days.

(21) Appl. No.: 10/139,344

(22) Filed: May 7, 2002

(65) Prior Publication Data
US 2002/0171128 A1   Nov. 21, 2002

(30) Foreign Application Priority Data
May 15, 2001   (JP) .............................. 2001-145219

(51) Int. Cl.
H01L 23/495 (2006.01)
H01L 23/29 (2006.01)
H01L 21/00 (2006.01)

(52) U.S. Cl. ................ 257/666; 257/667; 257/668; 257/669; 257/670; 257/671; 257/672; 257/673; 257/674; 257/675; 257/676; 257/677; 257/790; 438/111

(58) Field of Classification Search ................ 257/668; 438/111
See application file for complete search history.

(56) References Cited

U.S. PATENT DOCUMENTS

| | | | | |
|---|---|---|---|---|
| 5,258,331 A | * | 11/1993 | Masumoto et al. ............. | 29/827 |
| 5,276,351 A | * | 1/1994 | Yamazaki et al. ............ | 257/666 |
| 5,294,827 A | * | 3/1994 | McShane ...................... | 257/666 |
| 5,334,858 A | * | 8/1994 | Wada ........................ | 257/48 |
| 5,528,078 A | * | 6/1996 | Shin .......................... | 257/676 |
| 5,659,198 A | * | 8/1997 | Okutomo et al. ............. | 257/659 |
| 5,744,859 A | * | 4/1998 | Ouchida ...................... | 257/668 |
| 5,880,520 A | * | 3/1999 | Ma ........................... | 257/659 |
| 5,943,557 A | * | 8/1999 | Moden ........................ | 438/118 |
| 6,036,173 A | * | 3/2000 | Neu et al. .................... | 257/668 |
| 6,043,108 A | * | 3/2000 | Izumi et al. .................. | 438/111 |
| 6,063,650 A | * | 5/2000 | King et al. ................... | 438/123 |
| 6,066,515 A | * | 5/2000 | Schoenfeld .................. | 438/123 |
| 6,104,091 A | * | 8/2000 | Ito et al. ...................... | 257/738 |
| 6,258,629 B1 | * | 7/2001 | Niones et al. ................ | 438/111 |
| 6,297,964 B1 | * | 10/2001 | Hashimoto ................... | 361/760 |
| 6,342,729 B1 | * | 1/2002 | Takenaka et al. ............. | 257/669 |
| 6,380,620 B1 | * | 4/2002 | Suminoe et al. .............. | 257/706 |
| 6,410,977 B1 | * | 6/2002 | Hashimoto ................... | 257/673 |
| 6,570,099 B1 | * | 5/2003 | Hirano et al. ................ | 174/258 |
| 6,696,747 B1 | * | 2/2004 | Lee et al. ..................... | 257/666 |
| 6,744,120 B1 | * | 6/2004 | Yanagisawa ................. | 257/668 |

(Continued)

FOREIGN PATENT DOCUMENTS

JP     64-13127     1/1989

(Continued)

Primary Examiner—Carl Whitehead, Jr.
Assistant Examiner—James M Mitchell
(74) Attorney, Agent, or Firm—Rabin & Berdo, P.C.

(57) ABSTRACT

This invention is directed to preventing deformation, breakage, and the like of leads in a semiconductor device, reducing the fraction of defects, and making the semiconductor device smaller and thinner. In order to accomplish these objects, in a carrier including a base having a device hole and a plurality of leads for bonding a chip, the leads are provided with thin heat-resistant films.

14 Claims, 12 Drawing Sheets

U.S. PATENT DOCUMENTS

| | | | |
|---|---|---|---|
| 7,169,643 B1 * | 1/2007 | Hashimoto | 438/110 |
| 2001/0002724 A1 * | 6/2001 | Miyazaki et al. | 257/668 |
| 2002/0149027 A1 * | 10/2002 | Takahashi et al. | 257/100 |
| 2002/0180010 A1 * | 12/2002 | Tsubosaki et al. | 257/667 |
| 2003/0127713 A1 * | 7/2003 | Schoenfeld | 257/666 |

FOREIGN PATENT DOCUMENTS

| | | | |
|---|---|---|---|
| JP | 01205544 | * | 8/1989 |
| JP | 402022850 | * | 1/1990 |
| JP | 02-121344 | | 5/1990 |
| JP | 03173459 | * | 7/1991 |
| JP | 04-291737 | | 10/1992 |
| JP | 05-082593 | | 4/1993 |
| JP | 5-102253 | | 4/1993 |
| JP | 06-252215 | | 9/1994 |
| JP | 06-342969 | | 12/1994 |
| JP | 09-64092 | * | 3/1997 |
| JP | 11-214435 | | 8/1999 |
| JP | 11-214453 | | 8/1999 |
| JP | 2000-031212 | * | 1/2000 |

* cited by examiner

CARRIER WITH REINFORCED LEADS THAT ARE TO BE CONNECTED TO A CHIP

BACKGROUND OF THE INVENTION

1. Field of the Invention

The present invention relates to a semiconductor device and a method for producing the same.

2. Description of the Related Art

Various packaging forms for semiconductor devices have been developed as technical progress relating to semiconductor integrated circuits has developed and demand for higher density packaging by increasing a number of pins has increased.

A prior art is described below with reference to FIGS. 13A and 13B. FIG. 13A is a schematic plan view showing a conventionally produced tape carrier. FIG. 13B is a cross sectional view taken along dashed line B-B in FIG. 13A.

In a conventional tape carrier, a number of device holes 114 are arranged in a series along a long axis direction of an elongated photographic-film-like base tape 140 made of a polyimide film, or the like. A plurality of carry holes 142 is provided in the vicinity of both short-axis-directional ends of the base tape 140 along the long axis direction of the base tape 140, and parallel to the device holes 114, in order to facilitate carrying, and the like, of the base tape 140 during production, transportation, and the like, thereof. A plurality of leads 120 is formed at each of the device holes 114.

As shown in FIG. 13B, each of the leads 120 is formed by providing a thin copper wire 120a with a metal plating 120b, which metal plating 120b is for a later bonding to a chip. Further, a solder resist 132 for protecting a wiring pattern is placed over portions of the leads 120 which are located on the base tape 140. Although it is not shown in the drawings, a chip is bonded to the leads 120 at a device hole side using metal eutectic bonding or thermo-compression bonding. Thereafter, molding is carried out to package the chip. Finally, the tape carrier is cut into respective frames and surface mounting onto printed wiring boards or the like is performed.

In comparison to other packaging forms, the above-described tape carrier packaging is easily made smaller and thinner and is extremely suitable for high-density surface mounting. Therefore, its range of usage is expected to continue to extended.

However, in the conventional tape carrier, a chip is supported only by the leads 120 to which it is bonded. Further, since the chip is supported in a slightly downward offset position with respect to the device hole of the carrier in order to prevent electrical short circuits in the wiring, namely, between the leads 120, defects such as deformation and breakage of the leads have been caused even by slight impacts occurring, for example, when the elongated tape carrier is wound, during transportation of the tape carrier, or even during quality inspection of the tape carrier. A fraction defective due to such defects has reached 5 to 10%. Thus, in order to improve a yield and with consideration of the difficulty of quality control, there is a demand for an immediate countermeasure.

SUMMARY OF THE INVENTION

In view of the aforementioned problem in the prior art, an object of the present invention is to prevent deformation, breakage, and the like, of leads during production, transportation, quality inspection, and the like, as described above, by increasing stress resistance of leads provided on a base. That is, the present invention is directed to improve a yield and decrease a fraction defective of resulting semiconductor devices. Another object of the present invention is to contribute to making semiconductor devices even smaller and thinner.

In order to solve the above-described problem, a carrier for use with a chip of the present invention comprises a base having formed therein a hole for receiving the chip, a plurality of leads disposed on the base for bonding to the chip, and thin heat-resistant films provided on the leads.

According to this structure, stress resistance of the leads can be greatly increased and occurrences of deformation or breakage of the leads can be decreased.

Further, a method for producing a semiconductor device according to the present invention comprises the steps of forming a device hole in a base; attaching copper foil to the base; etching the copper foil to form leads; plating the leads; providing thin heat-resistant films on at least one of the leads and the base; bonding a chip to the leads; and covering the chip with a mold.

According to this production method, a carrier and a semiconductor device can be efficiently produced, whose leads have a greatly increased stress resistance, particularly at a device hole side thereof.

According to the structures of the carrier and the semiconductor device of the present invention, stress resistance of the lead portions can be greatly increased, and occurrences of deformation and breakage of the leads can be remarkably decreased. The fraction defective of conventionally 5 to 10% due to such lead defects is expected to be reduced to 1% or less. In addition, the present invention contributes to make semiconductor devices smaller and thinner.

DESCRIPTION OF THE PREFERRED EMBODIMENTS

Figure 1A:
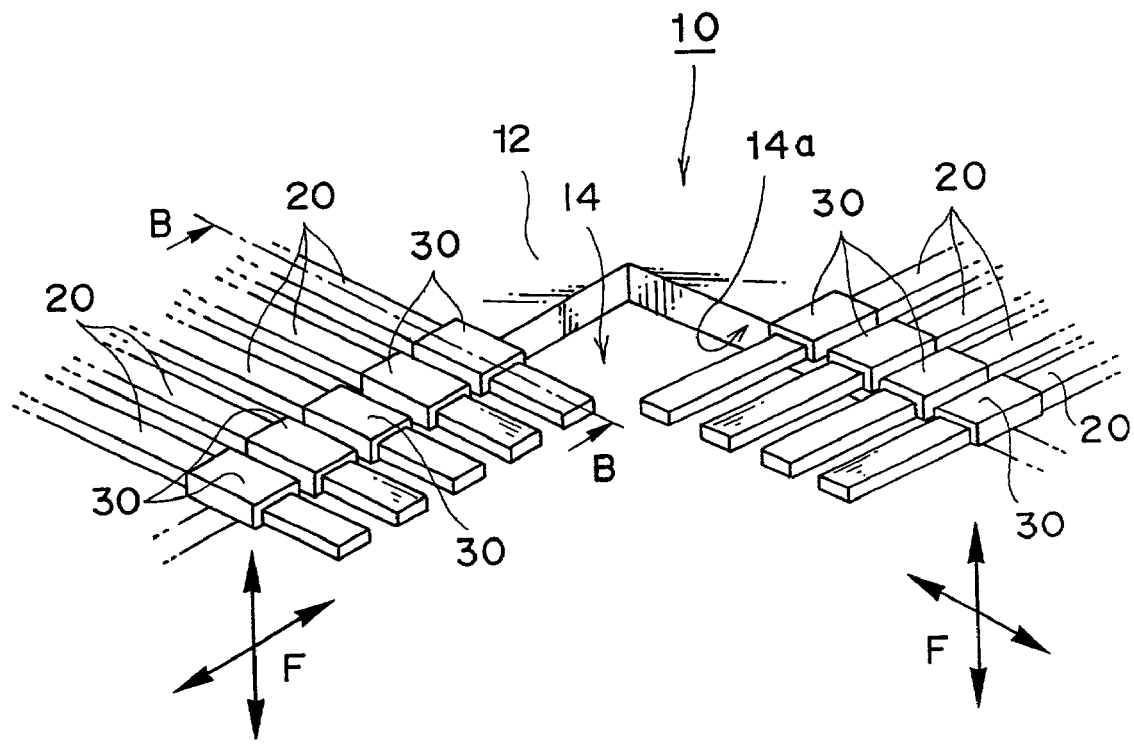
FIG. 1A is a perspective view showing a first embodiment of the present invention.

Hereinafter, embodiments of the present invention are described with reference to the drawings. Note that the drawings illustrate the present invention schematically, only in order to facilitate comprehension of the present invention, and are not intended to limit the present invention. In the drawings used in description below, like parts are designated by like reference numeral, and explanations thereof might be omitted.

First Embodiment

Figure 1B:
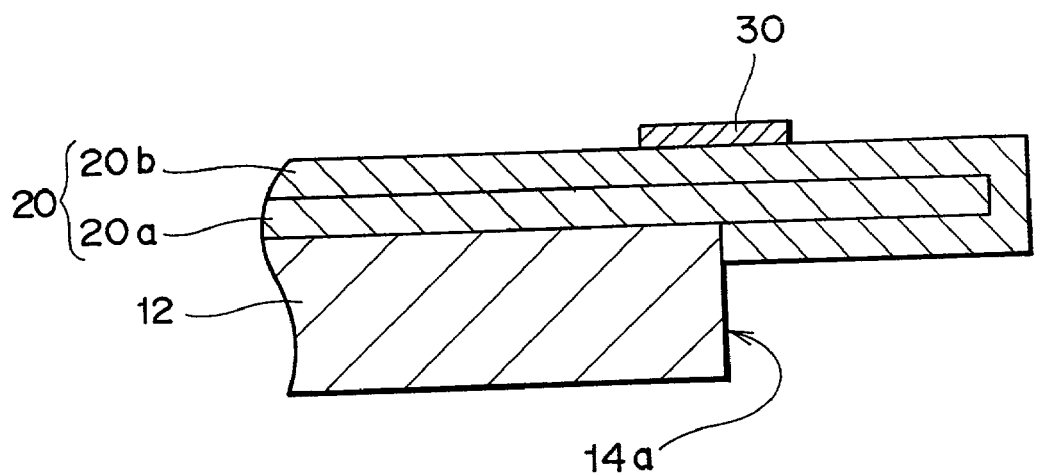
FIG. 1B is a sectional view showing the first embodiment of the present invention taken along chain line B-B in FIG. 1A.

FIGS. 1A and 1B illustrate a first embodiment of the present invention. FIG. 1A is a perspective view showing a device hole provided in a base and leads provided so as to project into the device hole, which view is enlarged so that a relationship of positions of the device hole, the leads and the base can be understood. FIG. 1B is a sectional view taken along chain line B-B in FIG. 1A.

With reference to FIGS. 1A and 1B, the first embodiment of the present invention is described. A carrier 10 of the present invention comprises a base 12 provided with a device hole 14, leads 20, and thin heat-resistant films 30 disposed on the leads 20. The thin heat-resistant films 30 are provided on upper and both side surfaces of the leads 20 at portions thereof above a device hole edge 14a in positions in which the thin heat-resistant films 30 extend over the device hole edge 14a. The thin heat-resistant films 30 disposed on the surfaces of the leads 20 are disposed independently for each lead 20 so that they are spatially apart from each other. A chip is bonded at device hole sides of the leads 20.

For the base in this first embodiment as well as all the embodiments described later, it is assumed that, preferably, a polyimide film, a polyester film, or the like, is being used in addition to substrates which are generally used for producing semiconductor devices, such as a silicon substrate, a glass substrate, an epoxy substrate, a glass-epoxy substrate, a ceramic substrate, and the like.

However, those skilled in the art can suitably select any of the above-listed substrates and films, and also can suitably select a base formed of a desirable material other than the above-listed substrates and films with consideration of properties, and the like, required for the base according to specifications of a semiconductor device.

Although the shape of the device hole 14 is rectangular in the exemplary structure shown in FIG. 1A, this is not intended to limit the present invention. For example, the shape of the device hole may be circular, elliptical, or the like (the same is true for embodiments described later).

The leads 20 are provided side by side on the base 12 so as to project from the device hole edge 14a into the device hole 14. As shown in FIG. 1B, each of the leads 20 is preferably formed by providing a thin copper wire 20a with a metal plating 20b. A cross-sectional form of the lead 20 is preferably rectangular or trapezoidal.

The metal plating 20b covers the entire surface of the lead 20 except a portion thereof contacting the base 12, that is, all exposed surfaces of the lead 20. The layer of the metal plating 20b is provided for bonding the chip and the lead 20 by bonding the chip to the metal plating 20b using metal eutectic bonding or thermo-compression bonding. A material for the plating may be (but not limited to), for example, Au, Sn, or the like. A suitable and desirable plating material can be selected according to a shape of the chip to be bonded, properties of pads and bonding areas, and the like (the same is true for embodiments described later).

A material used for the thin heat-resistant film of the present invention is determined with consideration given to heat resistance, which is the first priority, as well as to stress resistance, flexibility, and the like. Either insulative materials or conductive materials can be used as the material for the thin film, and examples of the insulative materials preferably include polyimide resins, epoxy resins, urethane resins, and the like. More preferably, the material is a polyimide resin.

The conductive material includes, for example, pure nickel, and the like. When the conductive material is used for the thin heat-resistant films 30, the conductive thin heat-resistant films 30 need to be provided independently for each lead 20 in order to prevent short circuits in the wiring, namely, between the leads 20.

According to this structure wherein the leads are provided with the thin heat-resistant films 30, when the chip is bonded at the device hole sides of the leads 20 of the carrier of the present invention, portions of the leads 20 immediately above and/or in the vicinity of the device hole edge, in which vicinity stresses in respective directions of arrows F or stresses in directions composed of combinations of these directions are concentrated, can be effectively strengthened. Thus, deformation, breakage, and the like, of the leads can be prevented and a fraction defective of carriers can be drastically decreased.

Figure 2A:
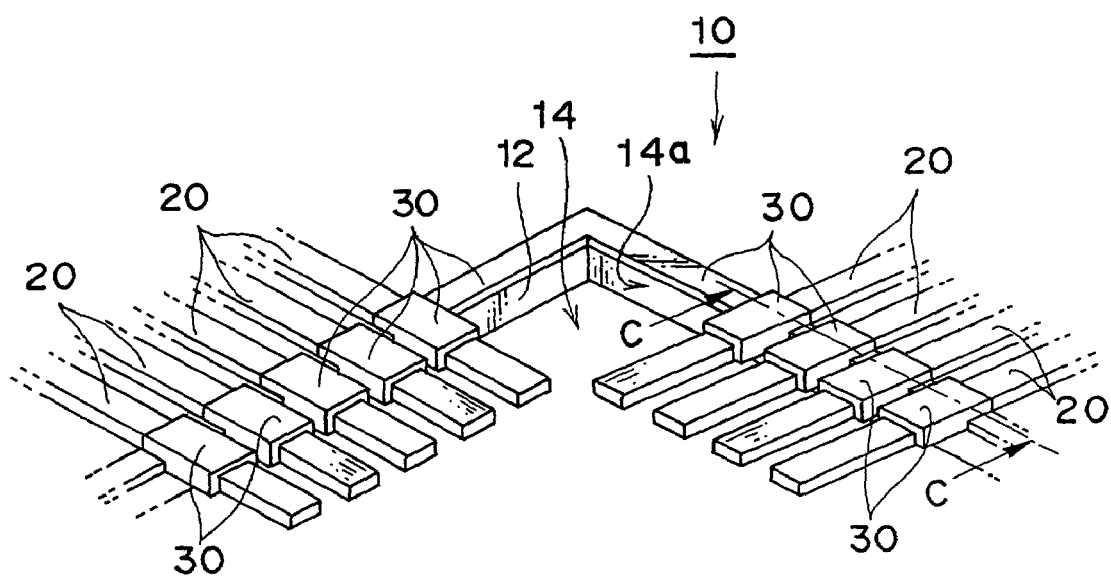
FIG. 2A is a perspective view showing a modification of the first embodiment of the present invention.
Figure 2B:
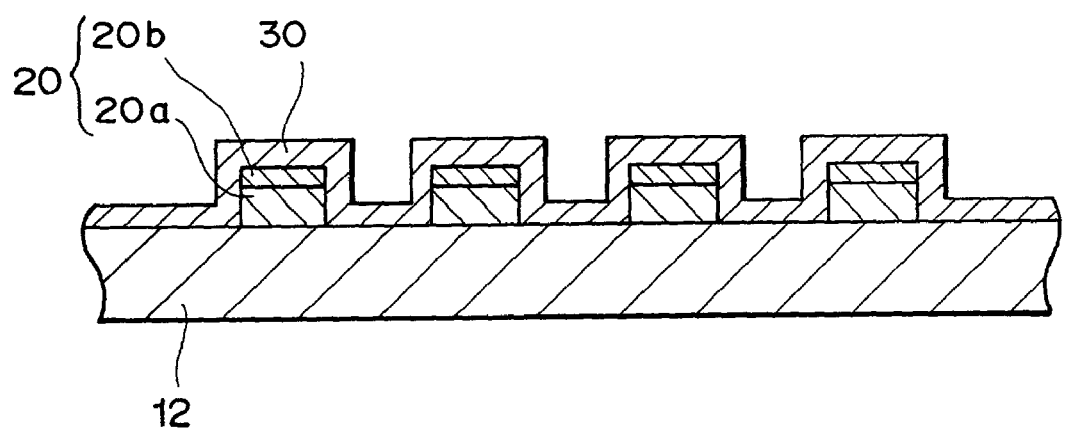
FIG. 2B is a sectional view showing the modification of the first embodiment of the present invention taken along chain line C-C in FIG. 2A.

FIGS. 2A and 2B illustrate a modification of the first embodiment of the carrier of the present invention. FIG. 2A is a perspective view showing a device hole provided in a base and leads, which are provided so as to project into the device hole. The perspective view is enlarged so that a relationship of positions of the device hole, the leads and the base can be understood. FIG. 2B is a sectional view taken along chain line C-C in FIG. 2A.

In this modification, similarly to the first embodiment, the thin heat-resistant films 30 are provided on the upper and both of the side surfaces of the leads 20 at portions thereof above the device hole edge 14a of the device hole 14, in positions in which the thin heat-resistant films 30 extend over the device hole edge 14a. In this example, the thin heat-resistant films 30 are further provided on the edge areas of the base 12 so as to continue into the parts of the regions, which are above the base 12 and between the thin heat-resistant films 30 that are provided on the upper and both side surfaces of the leads 20, so as to be equal in width to the regions. Therefore, the thin heat-resistant films 30 are also provided on the base 12 at areas between the leads 20. That is, in this modification, the thin heat-resistant films 30 are provided continuously across the leads 20.

Since the thin heat-resistant films 30 are continuous in this modification, they need to be formed of an insulative material in order to prevent short circuits in the wiring, namely, between the leads 20.

According to this modification, the continuous thin heat-resistant films 30 can be formed at once by a simple step such as injecting, coating or spraying the material of the thin heat-resistant films, and complicated steps such as a resist forming step are not necessary. Therefore, this structure is preferable for more industrial productions, and improvements in cost-performance are also expected.

Second Embodiment

Figure 3A:
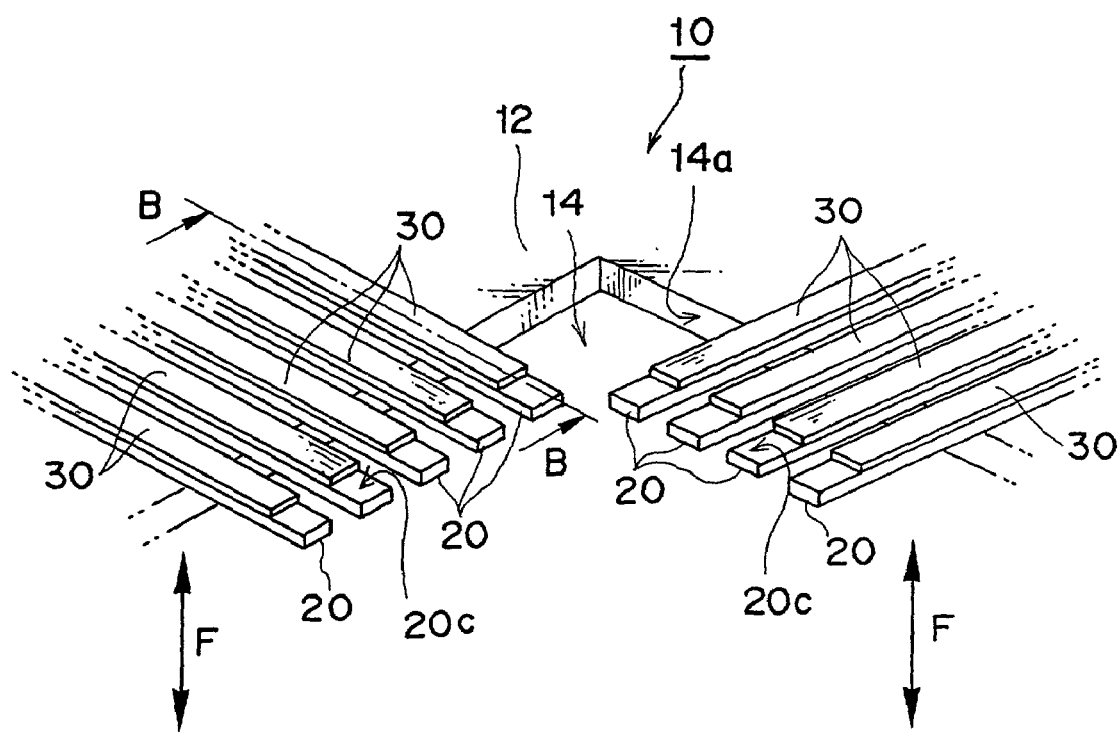
FIG. 3A is a perspective view showing a second embodiment of the present invention.
Figure 3B:
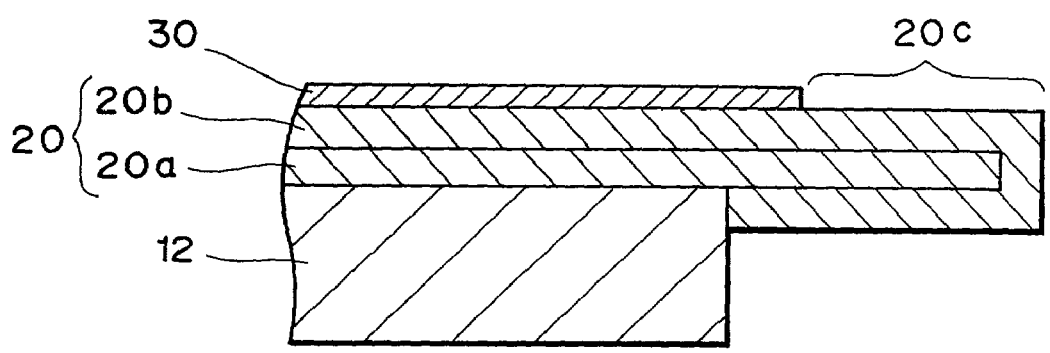
FIG. 3B is a sectional view showing the second embodiment of the present invention taken along chain line B-B in FIG. 3A.

FIGS. 3A and 3B schematically illustrate a second embodiment of the carrier of the present invention. FIG. 3A is a perspective view showing main portions of the carrier of the present invention which view is enlarged so that a relationship of positions of the device hole 14, the leads 20 and the base 12 can be understood. FIG. 3B is a sectional view taken along chain line B-B in FIG. 3A.

In this embodiment, the thin heat-resistant films 30 are formed widely over the upper surface areas of the leads 20 (also called "non-chip-mounting areas") other than upper surface areas to be bonded to the chip (also called "chip-mounting areas").

Generally, the chip is bonded to the carrier by bonding a plating material provided on the leads 20 and bonding areas of the chip (i.e., Au bumps, or the like) using metal eutectic bonding or thermo-compression bonding. Therefore, "areas to be bonded to the chip" or chip-mounting areas in the present invention refers to areas which are sufficient for bonding the leads to the chip by fusing the metal plating, which is disposed on at least upper surfaces of the leads 20, or in some cases, on upper, lower and/or side surfaces (one or both sides) of the leads, and bonding the metal plating to pads, Au bumps, or the like of the chip. These areas correspond to areas designated by reference numeral 20c in FIGS. 3A and 3B. A length of the areas in a long-axis direction of the leads is suitably determined depending on conditions of the pads, the Au bumps, and the like, of the chip, but is preferably 60 to 100 µm.

As described above, according to the structure wherein the thin heat-resistant films 30 are provided on the upper surface areas of the leads 20 other than the chip mounting areas 20c, stress resistance of tips of the leads 20 which project into the device hole 14 is expected to increase even more than in the first embodiment against the stresses F, particularly against the stresses F in directions perpendicular to long and short axes of the leads 20, i.e., in the vertical directions.

Third Embodiment

Figure 4:
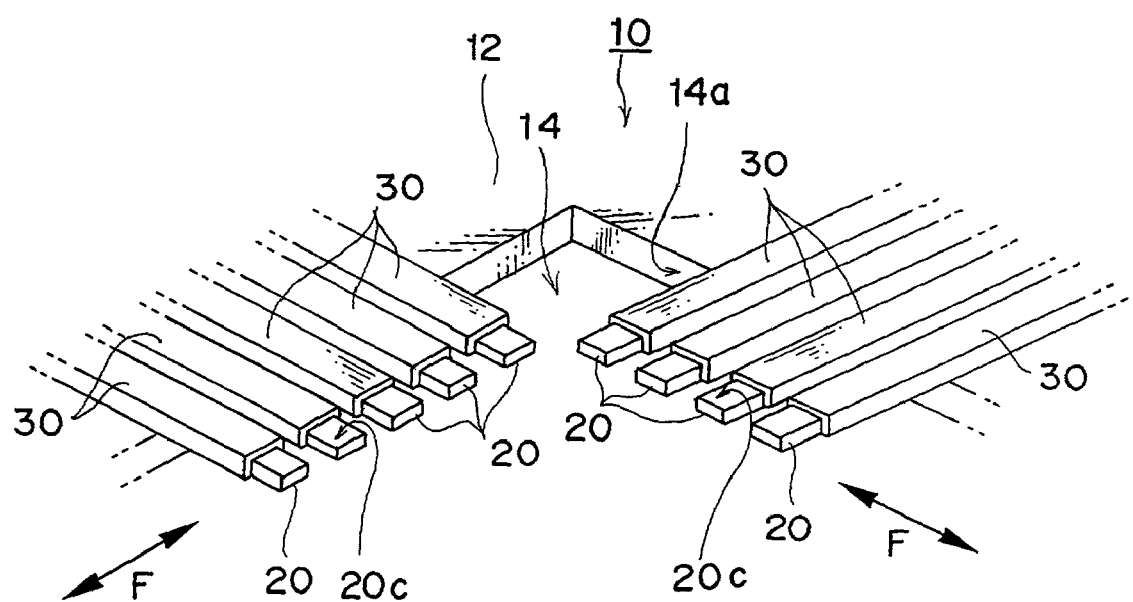
FIG. 4 is a perspective view showing a third embodiment of the present invention.

FIG. 4 is a perspective view schematically illustrating a third embodiment of the carrier of the present invention. In an exemplary structure of the third embodiment, in addition to the structure in the second embodiment, the thin heat-resistant films 30 are also provided on both side surfaces of the leads 20 other than the areas thereof to be bonded to the chip, or the chip-mounting areas 20c.

According to this structure, in addition to the effects of the second embodiment, stress resistance can be more effectively given to the leads 20, particularly against stresses F applied in the short-axis directions of the leads 20, i.e., in lateral directions. Therefore, deformation, breakage, and the like, of the leads 20 can be more effectively prevented.

Fourth Embodiment

Figure 5:
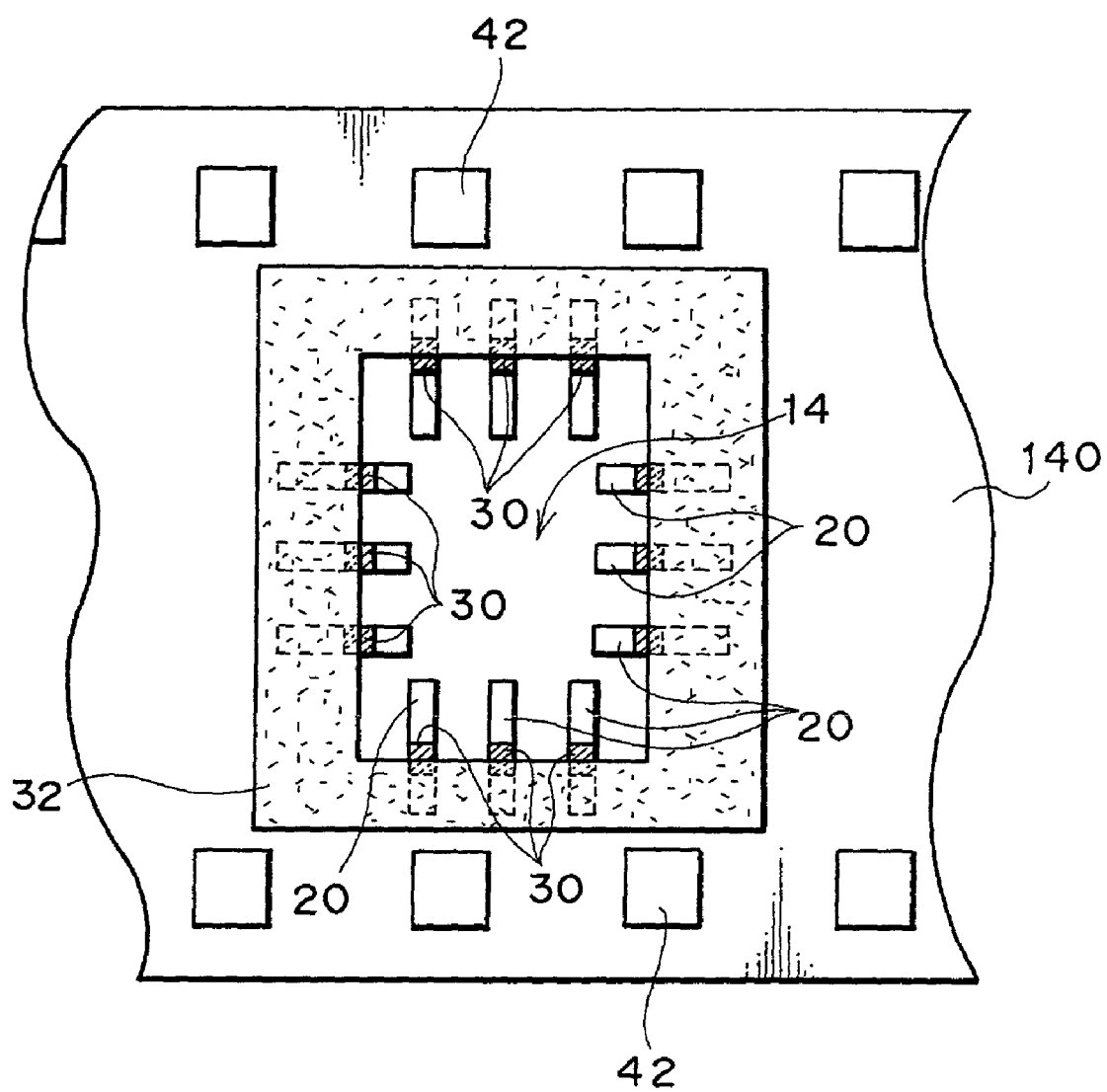
FIG. 5 is a plan view showing a fourth embodiment of the present invention.

FIG. 5 is a plan view schematically illustrating a fourth embodiment in which the structure of the carrier of the present invention is applied to a base tape. According to this exemplary structure, the leads 20 are provided on a base tape 140 in which the device hole 14 is provided. In this exemplary structure, the base tape 40 is provided with carry holes 42 at an equal pitch along both side edges thereof. The device holes 14 are provided in a line in an approximate center in a width direction of the base tape 140 along the carry holes 42. Further, a solder resist 32 is provided on the periphery of the edge of each of the device holes 14. The leads 20 described above are spaced from each other and arranged side by side around the device hole 14. The tips of the leads 20 at one side thereof project into the device hole. The thin heat-resistant films 30 are provided on the upper and on both of the side surfaces of the leads 20 so as to extend over a boundary between the device hole 14 and the solder resist 32. The material, the size, and the like, of the base tape are not particularly limited as long as the base tape can be applied to production of a so-called tape carrier. Although it depends on conditions, generally, about 1000 tape carrier semiconductor devices are produced using a base tape having a length of about 40 meters. Examples of the base tape include a polyimide tape, a polyester tape, and the like. Among them, a polyimide tape is preferable.

Fifth Embodiment

Figure 6:
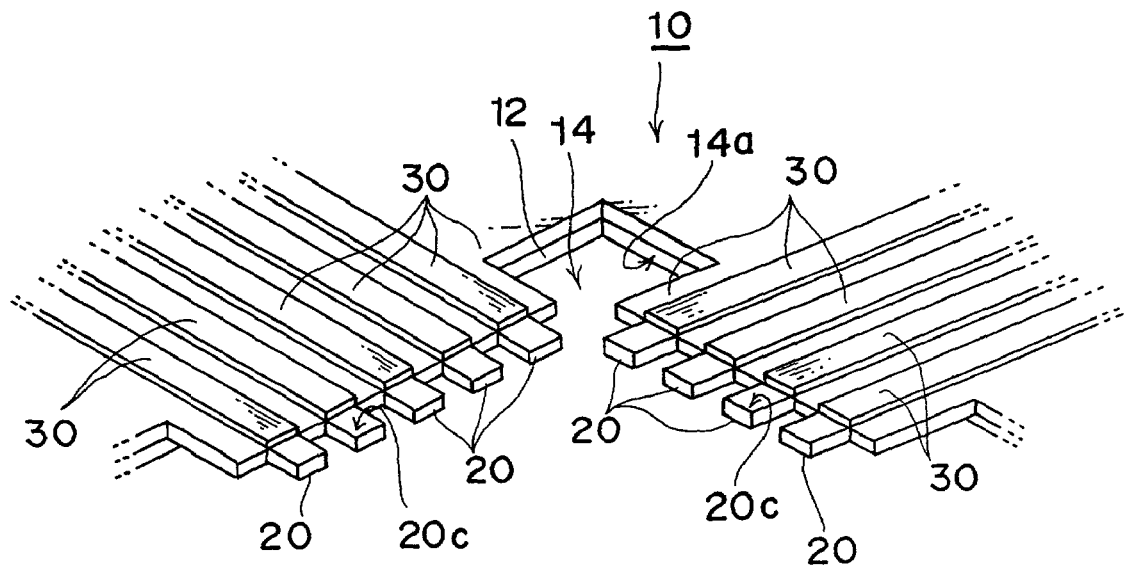
FIG. 6 is a perspective view showing a fifth embodiment of the present invention.

FIG. 6 is a perspective view schematically illustrating a fifth embodiment of the present invention. In this exemplary structure, the thin heat-resistant films 30 are provided on the base 12 so as to fill spaces between the leads 20. Further, on the side surfaces of portions of the leads 20 projecting into the device hole 14, which are outside of the chip-mounting areas 20c, the thin heat-resistant films 30 are provided continuously from the thin heat-resistant film 30 on the base 12. The projecting portions of the thin heat-resistant films 30 fill spaces between both side surfaces of the respective leads 20. Furthermore, the thin heat-resistant films 30 are also provided over upper surfaces of the respective leads 20 other than the chip-mounting areas 20c.

In this way, the thin heat-resistant films 30 are provided: on areas of side and upper surfaces of the leads 20 other than chip-mounting areas; and on portions of the base 12 between adjacent leads 20 and on portions of the base 12 in the vicinities of endmost leads 20; so that the thin heat-resistant films 30 extend, in the direction of the hole 14, on regions of the upper and side surfaces of the leads 20, which regions are not chip-mounting areas.

When the shape of the device hole 14 is, for example, circular or elliptical, the above-described portions of the thin heat-resistant films 30 which extend between adjacent leads 20 into the device hole 14 may be divided by slitting them, for example, at intervals of one eighth of the circumference of the circle or ellipse, so that the leads 20 can have flexibility with some directionality (the same is true for embodiments described later).

This structure exhibits more effective stress resistance against stresses applied in directions in which the respective leads 20 are twisted, than the third embodiment.

Figure 7:
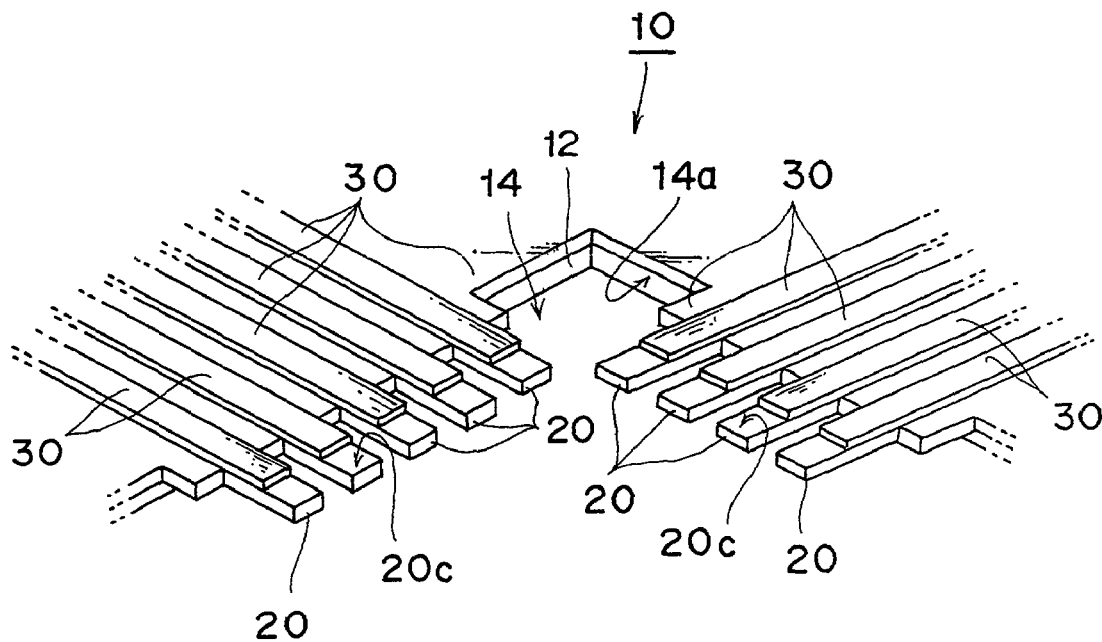
FIG. 7 is a perspective view showing a modification of the fifth embodiment of the present invention.

FIG. 7 is a perspective view schematically illustrating a modification of the fifth embodiment. This modification is an example in which the projecting length of the thin heat-resistant films 30, which are provided in the spaces between the adjacent leads 20 and the outer vicinity of the endmost leads 20 so as to project into the device hole 14, is shorter than those in the exemplary structure described with reference to FIG. 6. The thin heat-resistant films 30 are provided: on areas of side and upper surfaces of the leads 20 other than chip-mounting areas; on portions of the base 12 both between adjacent leads 20 and in the vicinities of endmost leads 20; and between portions of adjacent leads 20 which project into the device hole 14.

According to this structure, stress resistance of portions of the leads 20 immediately above and/or in the vicinity of the device hole edge 14a, and the like, where stress is concentrated, can be more effectively increased than the fifth embodiment, while maintaining flexibility of the respective leads 20.

Sixth Embodiment

Figure 8:
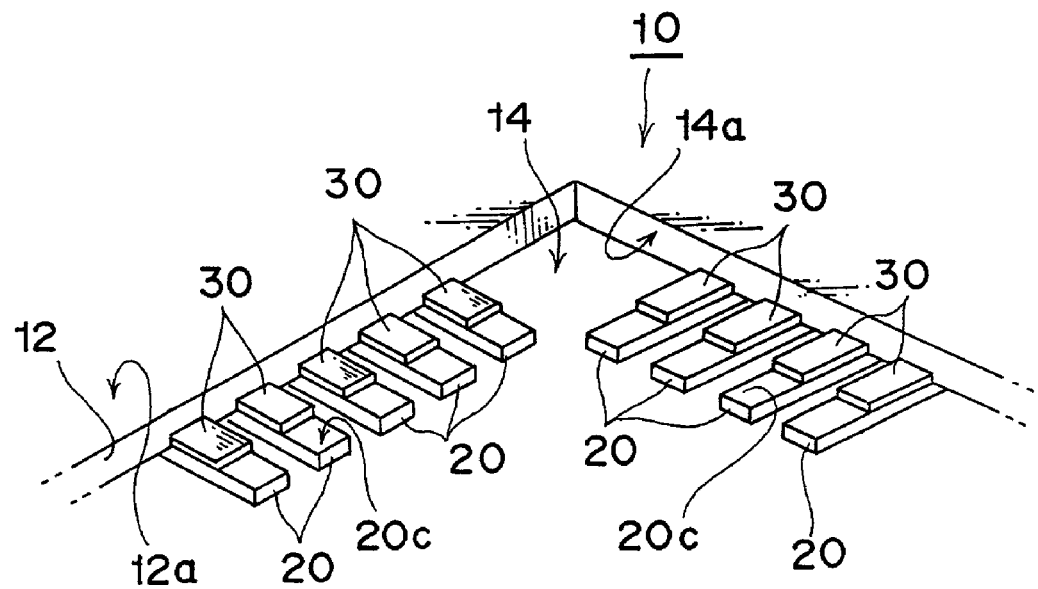
FIG. 8 is a perspective view showing a sixth embodiment of the present invention.

FIG. 8 schematically illustrates a sixth embodiment. It is a perspective view viewed from a base back surface 12a and is enlarged so as to facilitate understanding of a relationship of positions of the base 12, the leads 20 and the thin heat-resistant films 30.

In this exemplary structure, the thin heat-resistant films 30 are also provided on back surfaces of the respective leads 20. That is, in addition to the structures of the first to fifth embodiments described above, the thin heat-resistant films 30 are provided on areas of under surfaces (back surfaces) of the portions of the leads 20 projecting into the device hole 14 from the device hole edge 14a to edges of the chip-mounting areas 20c to the extent that they do not hinder chip-bonding in a later step.

Since the leads 20 are provided with a reinforcing material, namely, the thin heat-resistant films 30 at the top and bottom surfaces thereof, stress resistance of the leads 20 can be more effectively increased.

When the thin heat-resistant films in this structure are formed of an insulative material, there is no concern of short circuits between the leads 20. Therefore, the leads 20 can be bonded to the chip at portions nearer to the center thereof. This enables to reduce or eliminate an amount of the downward offset of the chip with respect to the base. In addition, since the stiffness of the leads themselves is remarkably increased, there is no need to mold all of the leads 20, and therefore the package can be made smaller and/or thinner.

Figure 9:
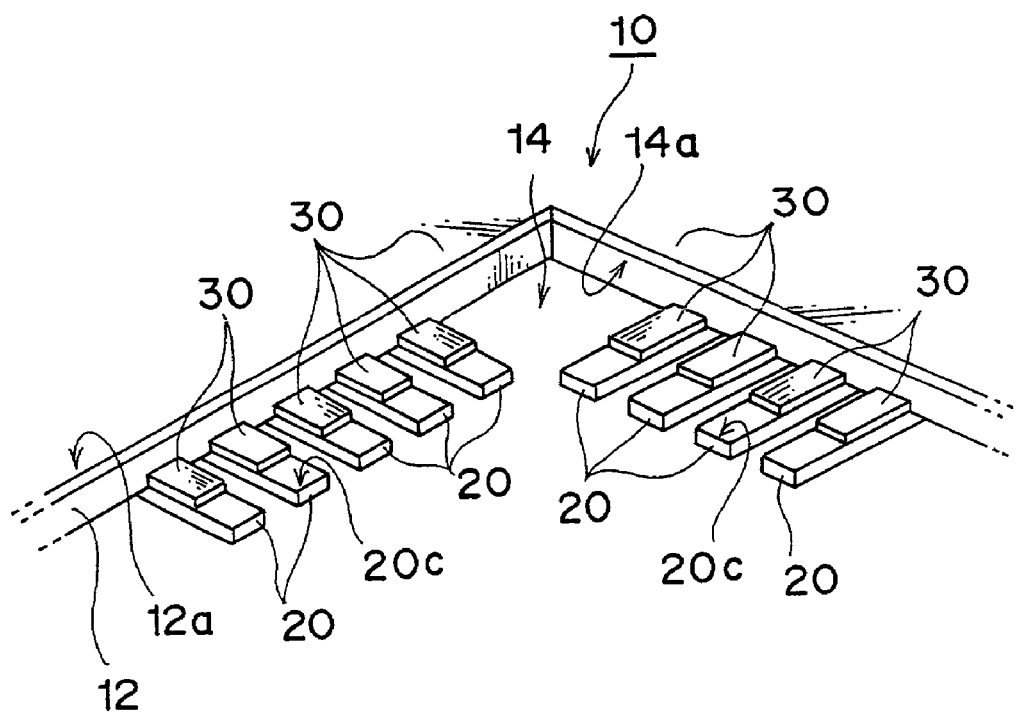
FIG. 9 is a perspective view showing a modification of the sixth embodiment of the present invention.

FIG. 9 is a schematic perspective view illustrating a modification of the sixth embodiment viewed from a base back surface 12a and is enlarged, similarly to FIG. 8, so as to facilitate understanding of a relationship among the positions of the base 12, the leads 20 and the thin heat-resistant films 30. In addition to the structure of the sixth embodiment, the thin heat-resistant film 30 is also provided on the base back surface 12a.

According to this structure, in addition to the effects obtained by the sixth embodiment, complicated pattern forming steps, such as a photoresist forming step, in the production process can be omitted, and the production process can be further simplified. Therefore, production costs of the semiconductor device can be reduced.

As described above, the material for the thin heat-resistant films 30 applied to the structures of the present invention is determined with consideration to heat resistance, stress resistance and flexibility. Since the thin heat-resistant films 30 experience high temperatures of 500° C. or more during bonding of the leads 20 and the chip, heat resistance is most important. When stress resistance and flexibility are considered necessary as well, for example, polyimide resins, epoxy resins, urethane resins, and the like, are preferable. Among them, polyimide resins are particularly preferable.

Effective thickness of the resin films is at least 10 μm. The upper limit of the film thickness is not particularly specified as long as the film thickness is within a range in which the objects of the present invention such as flexibility of the leads 20 are not impaired.

Further, a conductive material can also be used for the thin heat-resistant films 30 of the present invention. The conductive material preferably includes, for example, pure nickel.

When the conductive material is used, the thin heat-resistant film 30 needs to be independently provided for each lead 20 in order to prevent short circuits between the leads 20.

Figure 10A:
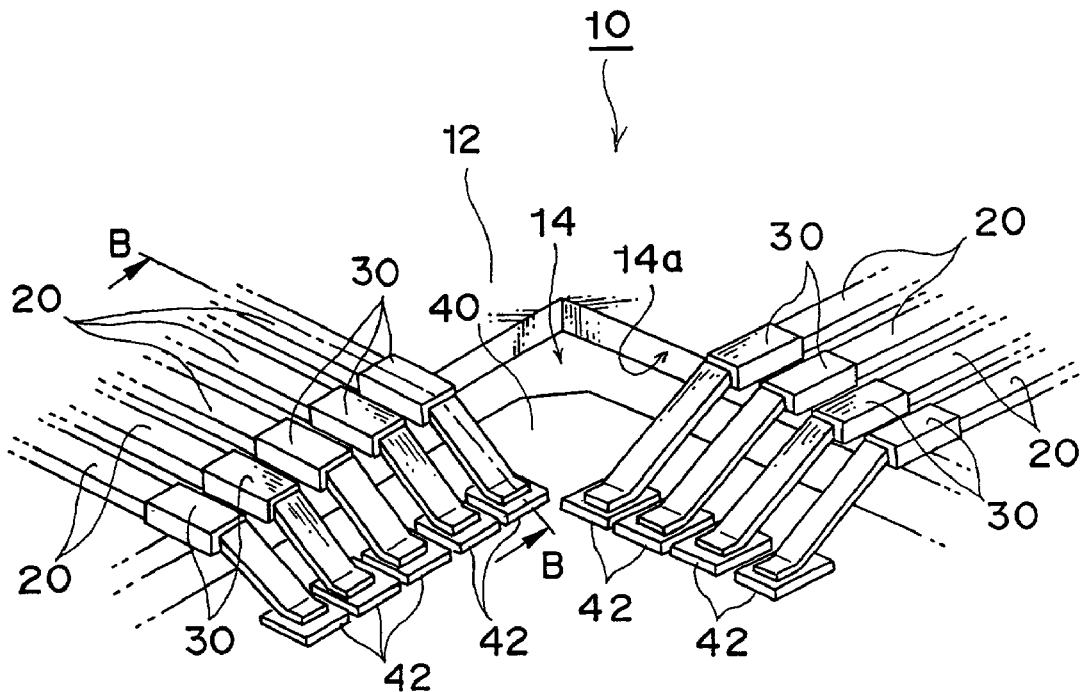
FIG. 10A is a perspective view showing a seventh embodiment of the present invention.
Figure 10B:
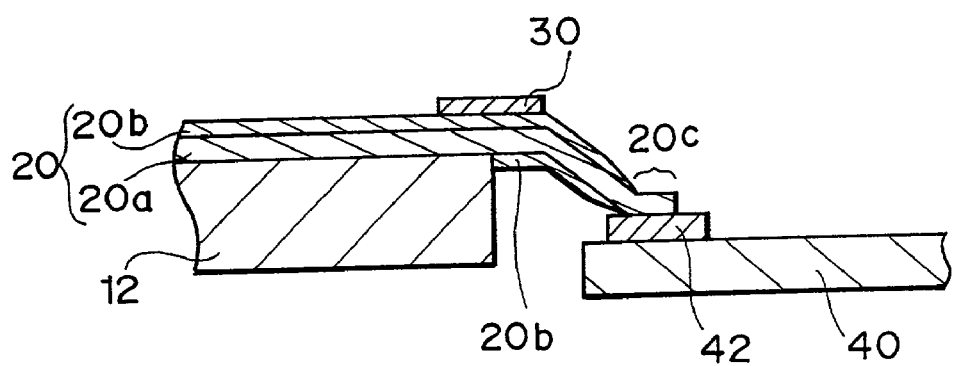
FIG. 10B is a sectional view showing the seventh embodiment of the present invention taken along chain line B-B in FIG. 10A.

FIGS. 10A and 10B schematically illustrate a seventh embodiment of the present invention. FIG. 10A is a perspective view showing the device hole portion of the semiconductor device formed by bonding a chip to the carrier of the first embodiment, which is enlarged to facilitate understanding of the relationship of the positions among the leads, the base and the chip. FIG. 10B is a sectional view taken along chain line B-B in FIG. 10A. Although only the carrier of the first embodiment is shown as an example, the bonding of the chip 40 is similarly carried out for all the other embodiments.

The chip 40 is provided with bump structures 42 for bonding to the leads 20 of the carrier 10. It is preferable that the bump structures 42 essentially comprise Au. However, other means and materials can be suitably selected depending on conditions such as the method for bonding, the shape of the chip, and the like, as long as the objects of the present invention are not impaired.

In this embodiment, the leads 20 are bonded to the bump structures 42 using metal eutectic bonding or thermo-compression bonding. Therefore, since portions of the metal platings 20a of the leads 20 which correspond to the chip-mounting areas 20c and vicinities thereof melt and are integrated with the bump structures 42, thickness of the leads 20 is reduced around the bonding areas.

At this time, in order to prevent short circuits between the leads 20, the chip 40 is disposed in a slightly downward offset position with respect to the base 12.

According to the structure of this embodiment, by flexing with the leads 20, the thin heat-resistant films 30 can absorb and disperse stresses at portions of the leads 20 immediately above and/or in the vicinity of the device hole edge 14a, where stresses that bend the leads 20 in vertical and lateral directions concentrate.

As described above, since the thin heat-resistant films 30 serve as a reinforcing material, the stress resistance of the leads 20 bonded to the chip 40 can be more effectively increased.

Eighth Embodiment

Figure 11A:
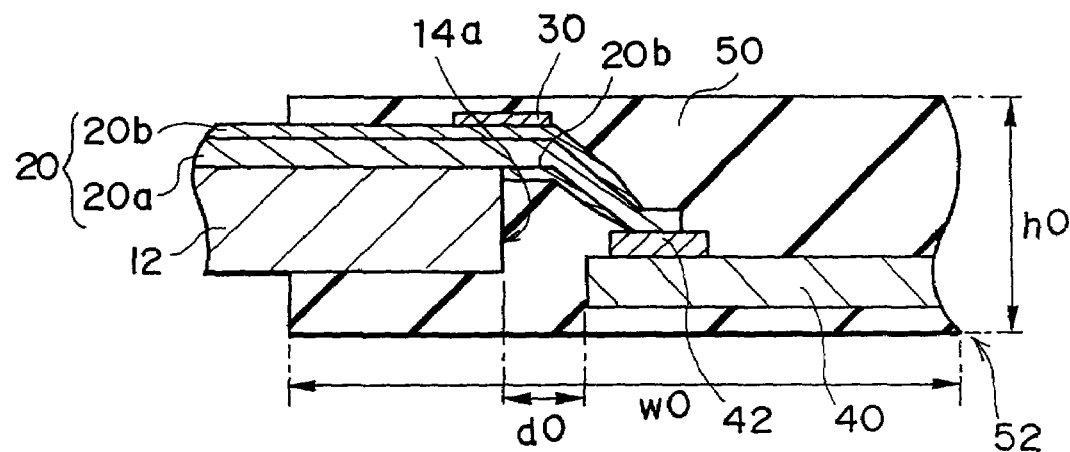
FIG. 11A is a sectional view showing an eighth embodiment of the present invention.
Figure 11B:
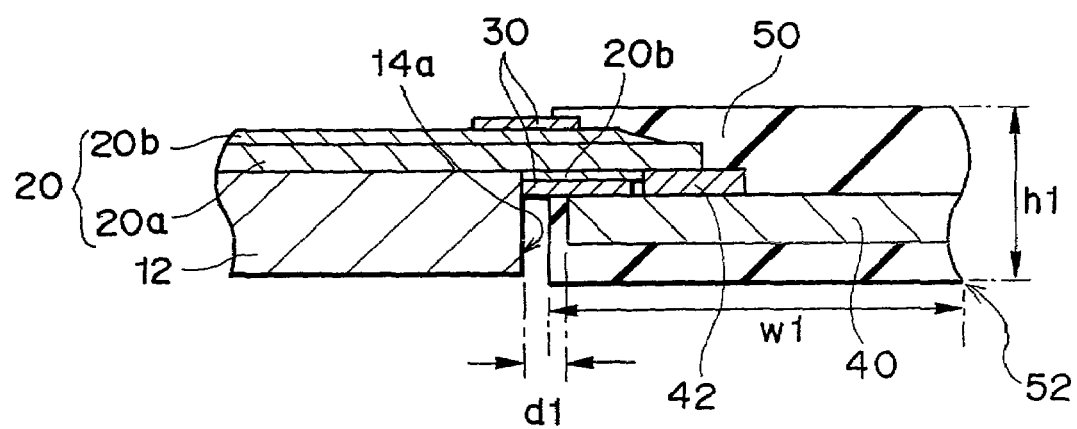
FIG. 11B is a sectional view showing the eighth embodiment of the present invention.

FIGS. 11A and 11B are sectional views schematically illustrating an eighth embodiment of the present invention.

As a representative structure of the present invention, an example to which the first embodiment is applied is shown. However, the structures of the other embodiments included in the present invention can also be applied to the eighth embodiment.

In FIGS. 11A and 11B, h0 and h1 respectively represent a thickness of a mold, and a shape of an upper surface or a lower surface of the mold is assumed to be square or circular, one half of a width of the mold is set as a mold center point 52. w0 and w1 respectively represent a length of a vertical line segment which is drawn between a straight line or a tangent of a curved line forming an extension of the mold 50, and a line drawn through the mold center point 52, and is parallel to the straight line or the tangent forming the extension of the mold 50. That is, w0 and w1 respectively represent a radius when the mold is circular, or one half of a length of a side when the mold is square. d0 and d1 respectively represent a distance between the device hole edge 14a and a side surface of the chip 40.

FIG. 11A is a sectional view schematically illustrating an embodiment of a packaged semiconductor device which is packaged by bonding the chip 40 to the carrier shown in the first embodiment (corresponding to the seventh embodiment), and providing a mold 50 according to a usual method.

The chip 40 is bonded to the carrier in a slightly downward offset position with respect to the base 12 in order to prevent short circuits between the leads 20. Then, the mold 50 is provided so that the leads 20 are not exposed to the outside.

A material of the mold 50 is suitably selected from among conventionally used plastics, resins, ceramics, glass ceramics, and the like, such that the objects of the present invention are not impaired, and the mold 50 is formed.

FIG. 11B is a sectional view schematically showing a packaged semiconductor device which is packaged by bonding the chip 40 to the carrier of the first embodiment, which is further provided with the insulative thin heat-resistant films 30 on lower surfaces of the leads 20 thereof (see the sixth embodiment and the modification thereof), and then, providing the mold 50 according to a usual method.

If thin heat-resistant films 30 provided on the lower surfaces of the leads 20 are insulative, as in this case, the chip 40 can be bonded to the carrier without offsetting the chip 40 slightly downward with respect to the base 12. Further, the leads 20 can be bonded to the chip at portions of the chip nearer to the center thereof. Furthermore, since the stiffness of the leads 20 themselves are increased, the chip 40 can be supported by the leads 20 alone.

According to this embodiment, the parameters w0, h0 and d0 relating to the size of the mold shown in FIG. 11A can be reduced to w1 (<w0), h1 (<h1) and d1 (<d0) respectively. That is, the mold thickness h0 can be reduced to h1, the one half of the mold length w0 can be reduced to w1, and the distance between the device hole edge 14a and the edge of the chip 40 d0 can be reduced to d1.

Therefore, in addition to the effect of increasing the stress resistance of the leads of the above-described embodiments, the mold itself or the semiconductor device including the mold can be made even smaller and thinner.

Ninth Embodiment

Hereinafter, a method for producing the carrier and the semiconductor device of the present invention is described with reference to FIGS. 12 and 13.

FIGS. 12A to 12G are sectional views schematically illustrating structures obtained in main steps of a process for producing the carrier of the present invention.

Figure 12A:
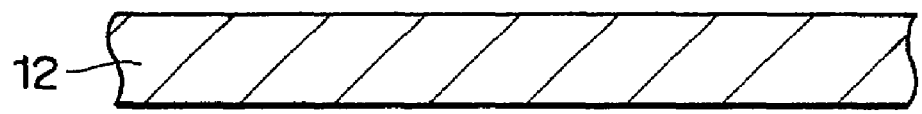
FIGS. 12A-12G respectively show a step in a series of steps for producing a carrier of the present invention.
Figure 12B:
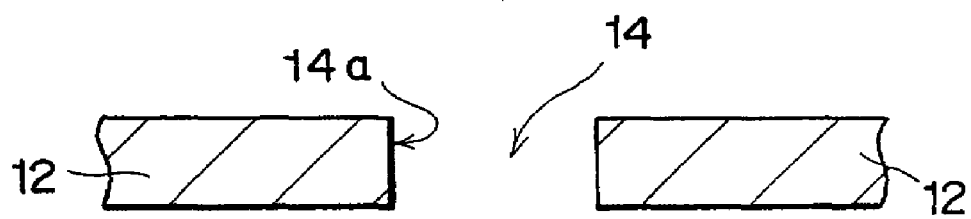
Figure 13A:
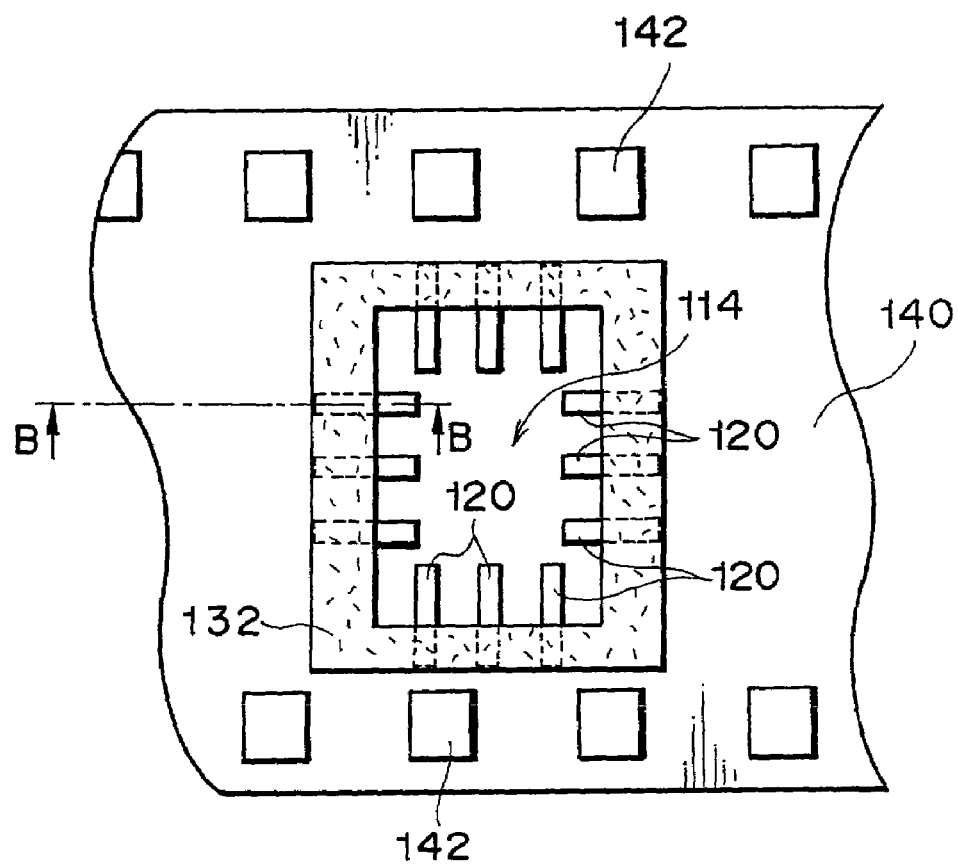
FIG. 13A is a plan view showing a prior art carrier.
Figure 13B:
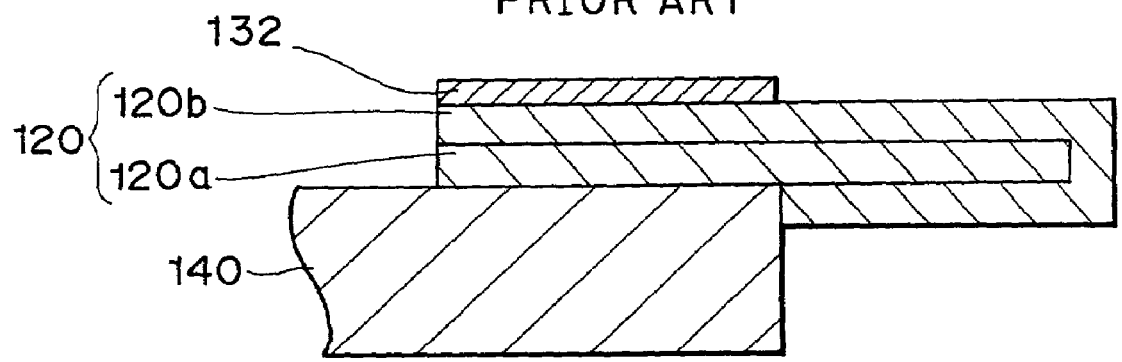
FIG. 13B is a sectional view showing the prior art carrier taken along dashed line B-B in FIG. 13A.

As shown in FIGS. 12A and 12B, the device hole 14 is formed in the base 12. Further, although not shown in these drawings, carry holes, and the like, may be provided as desired at the same time or a different time.

As described above, for the base 12, films such as a polyimide film, a polyester film, and the like, can be particularly preferably used in addition to substrates which are generally used for producing semiconductor devices, such as a silicon substrate, a glass substrate, an epoxy substrate, a glass-epoxy substrate, a ceramic substrate, and the like.

When the base 12 is a silicon substrate, a glass substrate, an epoxy substrate, a glass-epoxy substrate, a ceramic substrate, or the like, a method for forming the device hole can be suitably selected among physical-mechanical methods such as machining using a lathe or the like, and chemical methods including resist formation and etching, within a range in which the objects of the present invention are not impaired. When the base 12 is formed of a film such as a polyimide film, a polyester film, or the like, preferably, the device hole is formed mechanically with a puncher.

Figure 12C:
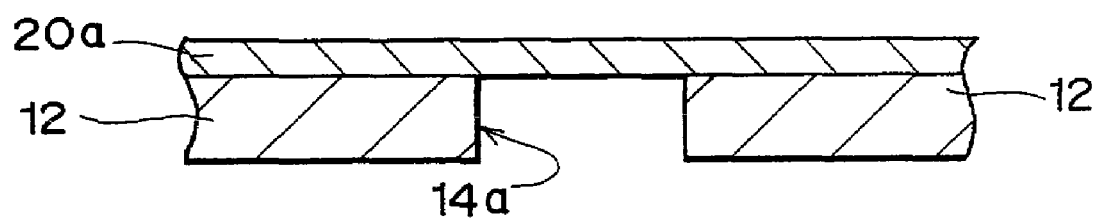
Figure 12D:
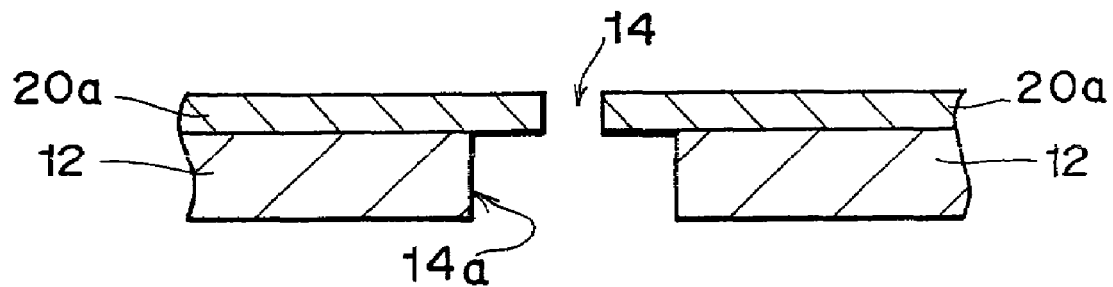

Subsequently, as shown in FIG. 12C, a copper foil 20a is attached on an upper surface of the base 12. Thereafter, as shown in FIG. 12D, the leads 20, which form a wiring of a circuit, are formed through a photoresist forming step and an etching step.

Figure 12E:
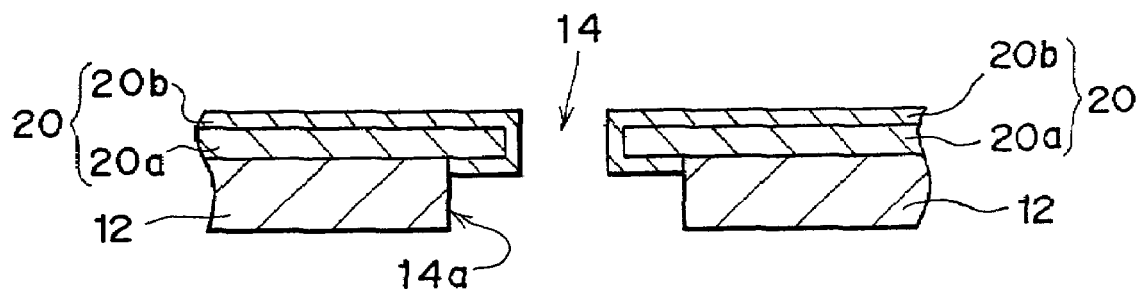
Figure 12F:
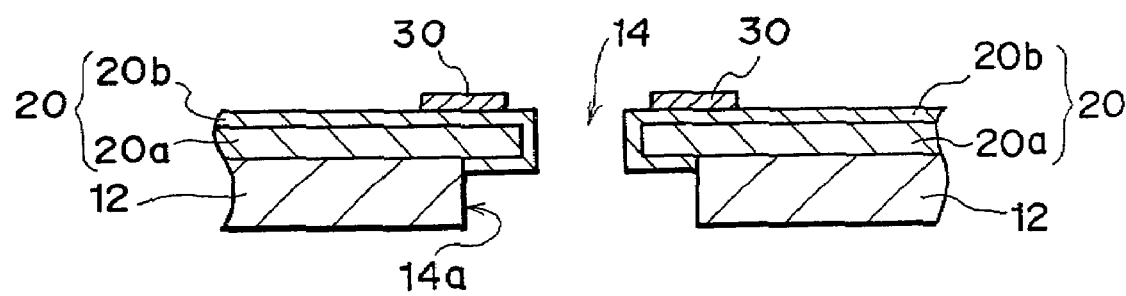

Then, as shown in FIG. 12E, the metal plating 20b is provided over the entire exposed surface of the respective leads 20. As described above, examples of a metal used for the plating include Au, Sn, and the like. However, these examples are not limiting, and the material for plating can be suitably selected depending on a method for bonding, a shape of a chip to be bonded, properties of pads and bonding areas, and the like.

Subsequently, a solder resist is formed for protecting a wiring pattern formed on the base 12, namely, the leads 20.

The step for forming the solder resist can be performed prior to the above-described step for providing the metal plating.

However, if the solder resist is formed prior to the metal plating, there is a risk that the resist may be partially peeled off during the following step for providing the metal plating, and exposed portions of the wiring may deteriorate due to aging. Therefore, it is preferable to provide the metal plating prior to forming the solder resist.

According to the method for producing the carrier of the present invention, the thin heat-resistant films 30 can be formed on the portion of the leads 20 on the base 12 and on the portion of the leads 20 projecting into the device hole 14 and in the vicinity of the device hole edge 14a as the solder resist for protecting the wiring pattern at the same time in the step for forming the solder resist. However, this production method can be used only when the material for the solder resist can be used as the thin heat-resistant film 30 without impairing the objects of the present invention.

The method for producing the carrier of the present invention is characterized in that the thin heat-resistant films 30 are provided on the upper surfaces or the upper and (both) side surfaces of the leads 20 at portions thereof in the vicinity of the device hole edge 14a.

Preferably, as shown in the modification of the first embodiment (see FIG. 2), the step for providing the thin heat-resistant films 30 is carried out by injection, coating, spraying, or the like, without using masks, or the like.

In this embodiment, the series of thin heat-resistant films 30 can be formed in a simple single step for, for example, injecting, coating or spraying the material of the thin heat-resistant film using necessary means, and complicated steps such as a resist forming step are not necessary. Therefore, it is suitable for more industrial productions, and an effect of reducing costs such as investments in equipment is also expected.

The thin heat-resistant films 30 are preferably provided on the upper surfaces of the leads 20 other than the chip-mounting areas 20c.

In addition, the thin heat-resistant films 30 are preferably provided further on the side surfaces of the leads 20 other than the chip-mounting areas 20c.

According to the above-described embodiment, the step for forming the solder resist can be combined into the step for providing the thin heat-resistant films 30. Note that, the thin heat-resistant films 30 can be provided on the upper and both side surfaces of the leads 20 at the same time in a single step.

Since the thin heat-resistant films 30 can be formed in a single step, it is very preferable from a viewpoint of cost reduction, and the like.

Conventionally, a heat resisting material having a small Young's modulus has been used as the material for the solder resist. However, the thin heat-resistant film 30 of the present invention is required to have, first of all, heat resistance, and is also required to have stress resistance and flexibility.

Therefore, polyimide resins, epoxy resins and urethane resins are preferable for the material of the thin heat-resistant film 30. Among them, polyimide resins are particularly preferable.

Further, according to the method for producing the carrier of the present invention, one or more steps for forming the thin heat-resistant films 30 of the present invention, including a step for providing the thin heat-resistant film 30 on the back surface of the base after the step for forming the solder resist by a usual method using a conventionally used solder resist material, or the like, can be separately performed.

Therefore, according to the method for producing the carrier of the present invention, preferably, the thin heat-resistant films 30 are provided on areas of side and upper surfaces of the leads 20 other than chip-mounting areas; and on portions of the base 12 between adjacent leads 20 and on portions of the base 12 in the vicinities of endmost leads 20; so that the thin heat-resistant films 30 extend, in the direction of the hole 14, on regions of the upper and side surfaces of the leads, which regions are not chip-mounting areas.

In another preferable example, the thin heat-resistant films 30 are provided on the lower surfaces of the leads 20 other than the chip-mounting areas 20c.

In yet another preferable example, the step for providing the thin heat-resistant films 30 further includes providing the thin heat-resistant film on the lower surface of the base.

These embodiments include two or more steps for providing the thin heat-resistant films 30. Thus, a more complicated providing pattern can be set and accomplished. Therefore, the leads 20 having increased stress resistance, which is one of the objects of the present invention, can be produced while conditions such as flexibility of the leads 20 and directions in which the leads 20 can be bent are finely controlled.

The thin heat-resistant films 30 formed, for example, of a resin can be formed on the surfaces of the base 12 and the leads 20 using a screen printing method, a photography method in which a photosensitive material is used and exposure and development are performed, or the like. Considering the costs, it is preferable to apply the screen printing method.

Further, a conductive material, preferably, for example, pure nickel, may be used for the thin heat-resistant films 30.

In this case, the thin heat-resistant films 30 need to be provided on the leads 20 independently from each other in order to prevent short circuits in the wiring. Therefore, the production method of this embodiment cannot be applied to the modification of the first embodiment, the fifth embodiment and the modification thereof, and applications thereof.

Formation of the thin heat-resistant films 30 from, for example, pure nickel is preferably carried out using metal vapor deposition.

In order to control areas in which the thin heat-resistant films 30 of the present invention are provided, masks such as a resist are used. If screen printing is applied and the above-described insulative resin is used to form the thin heat-resistant films 30, thin films can be formed on the upper and side surfaces of the leads 20 in a single step. If a complicated thin film pattern, such as one shown in the modification of the fifth embodiment, which includes a difference in levels between the thin film pattern on the upper surfaces of the leads 20 and that on the surface of the base 12 and on the portions of the leads 20 projecting into the device hole 14, is formed, it is preferable to combine two or more steps for forming the thin heat-resistant films 30.

Figure 12G:
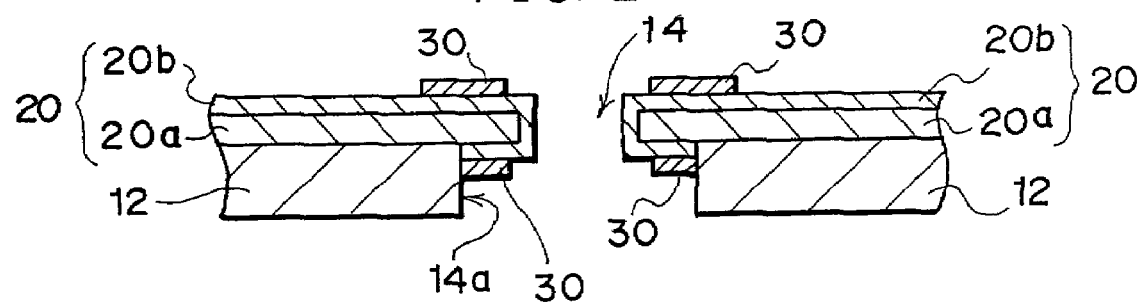

In addition, as shown in FIG. 12G, the thin heat-resistant films 30 may be formed on the lower surfaces of the leads 20, or on the lower surfaces of the leads 20 and the back surface of the base 12 (not shown in the drawing), as desired.

With reference to FIGS. 10A, 10B, 11A and 11B, a method for producing the semiconductor device of the present invention is described below. As shown in FIGS. 10A and 10B, the leads 20 are bonded to the bump structures 42 provided on the chip 40 using metal eutectic bonding or thermo-compression bonding. At this time, in order to prevent short circuits in the wiring, the chip 40 is disposed in a slightly downward offset position with respect to the base 12. Generally, an amount the chip is offset with respect to the base is about 80 μm.

Then, as shown in FIG. 11A, the mold 50 is formed according to a usual method of packaging the semiconductor device.

Through these steps, the base on which semiconductor devices respectively packaged with the carrier and the mold are provided side by side is obtained.

Thereafter, the series of packages are separated by cutting the base frame by frame to complete the semiconductor devices. Then, these semiconductor devices are surface-mounted on substrates to function.

As can be seen from FIG. 11B, in some of the embodiments of the present invention in which the insulative thin heat-resistant films 30 are provided on the lower surfaces of the leads 20, there is no need to offset the chip 40 with respect to the base 12 as described above. In addition, since the bonding can be carried out at portions of the chip 40 which are nearer to the center thereof, the parameters w0, h0 and d0 relating to the size of the mold can be reduced to w1 (<w0), h1 (<h0) and d1 (<d0) respectively as described above. Therefore, the package can be made even smaller and/or thinner.

Moreover, since the stress resistance and the stiffness of the leads 20 can be further increased, there is no need to enclose all of the leads 20 with the mold 50 so that the leads 20 are not exposed to the outside. That is, the package enclosed in the mold 50 within the extent of the device hole can be supported by the leads 20 alone.

This method and structure greatly facilitate packaging with the mold 50, and also are able to save a large amount of the mold material. Therefore, cost reduction, or drastic improvement of cost performance can be achieved.

Another aspect of the invention is a method for producing a semiconductor device comprising the steps of: forming a device hole in a base; attaching copper foil to the base; etching the copper foil to form leads; plating the leads; providing thin heat-resistant films on at least one of the leads and the base; bonding a chip to the leads; and covering the chip with a mold.

In the method, the step of providing the thin heat-resistant films may comprise providing the thin heat-resistant films on portions of upper and side surfaces of the leads at portions thereof in the vicinity of device hole edges.

In the method, the step of providing the thin heat-resistant films may comprise providing the thin heat-resistant films on portions of upper surfaces of the leads other than areas thereof to be bonded to the chip.

In the method, the step of providing the thin heat-resistant films may comprise providing the thin heat-resistant films on portions of side surfaces of the leads other than the areas thereof to be bonded to the chip.

In the method, the step of providing the thin heat-resistant films may comprise providing the thin heat-resistant films: on areas of side and upper surfaces of the leads, which areas of the leads are not for bonding to the chip; and on portions of the base between adjacent leads and on portions of the base in the vicinities of endmost leads;

so that the thin heat-resistant films extend, in the direction of the hole, on regions of the upper and side surfaces of the leads, which regions are not for bonding to the chip.

In the method, the step of providing the thin heat-resistant films may comprise providing the thin heat-resistant films on portions of lower surfaces of the leads other than areas thereof to be bonded to the chip.

In the method, the step of providing the thin heat-resistant films may comprise providing the thin heat-resistant film on a lower surface of the base.

In the method, the step of providing the metal plating may be carried out prior to the step of providing the thin heat-resistant films.

In the method, the step of providing the thin heat-resistant films may be carried out by screen printing.

In the method, the step of providing the thin heat-resistant films may be carried out by injection.

In the method, the step of providing the thin heat-resistant films may also perform the function of forming a solder resist.

The method may further comprise the step of forming a solder resist, which is performed separately from the step of providing the thin heat-resistant films.

What is claimed is:

1. A carrier for use with a chip, the carrier comprising a base having formed therein a hole for receiving the chip, a plurality of leads disposed on the base for bonding to the chip, and thin heat-resistant films provided over the base and the plurality of leads and extending beyond an edge of the hole, so as to adhere the leads around the periphery of the hole but not to cover end portions of the leads that are extended beyond the edge of the hole, wherein the thin heat-resistant films are provided at portions of upper and side surfaces of the leads, the portions being in the vicinity of the edge of the hole, wherein the thin heat-resistant films are further provided on lower surfaces of the leads at portions thereof which project into the hole, said portions not being areas of the leads for bonding to the chip, and wherein the base comprises base tape.

2. The carrier according to claim 1, wherein the portions of upper surfaces of the leads are portions that are not for bonding to the chip.

3. The carrier according to claim 2, wherein the portions of side surfaces of the leads are portions that are not for bonding to the chip.

4. The carrier according to claim 1, wherein the base tape comprises polyimide tape.

5. The carrier according to claim 1, wherein the thin heat-resistant films are additionally provided:

on portions of the base between adjacent leads and on portions of the base in the vicinities of endmost leads.

6. The carrier according to claim 1, wherein the thin heat-resistant film is further provided on a lower surface of the base.

7. The carrier according to claim 1, wherein the thin heat-resistant films comprise a resin selected from a group consisting of polyimide resins, epoxy resins and urethane resins.

8. The carrier according to claim 7, wherein the thin heat-resistant films comprise a polyimide resin.

9. The carrier according to claim 7, wherein the thin heat-resistant films have a thickness of at least 10 μm.

10. The carrier according to claim 1, wherein the thin heat-resistant films comprise pure nickel.

11. A carrier according to claim 1, wherein the thin heat-resistant films have a uniform thickness.

12. The carrier tape according to claim 1, wherein the hole has an area that is larger than the area of the chip, permitting the chip to be received within the hole when the leads are bonded to the chip.

13. The carrier tape according to claim 12, wherein the lower surfaces of the leads are bonded to the chip.

14. The carrier tape according to claim 1, wherein the lower surfaces of the leads are bonded to the chip.

* * * * *